(12) United States Patent
Kitahara et al.

(10) Patent No.: US 11,535,546 B2
(45) Date of Patent: Dec. 27, 2022

(54) SILICA GLASS CRUCIBLE

(71) Applicant: SUMCO CORPORATION, Tokyo (JP)

(72) Inventors: Ken Kitahara, Akita (JP); Masaru Sato, Akita (JP); Takuma Yoshioka, Akita (JP)

(73) Assignee: SUMCO CORPORATION, Tokyo (JP)

( * ) Notice: Subject to any disclaimer, the term of this patent is extended or adjusted under 35 U.S.C. 154(b) by 152 days.

(21) Appl. No.: 16/955,009

(22) PCT Filed: Nov. 2, 2018

(86) PCT No.: PCT/JP2018/040896
§ 371 (c)(1),
(2) Date: Jun. 17, 2020

(87) PCT Pub. No.: WO2019/167345
PCT Pub. Date: Sep. 6, 2019

(65) Prior Publication Data
US 2020/0392032 A1 Dec. 17, 2020

(30) Foreign Application Priority Data
Feb. 28, 2018 (JP) .............................. JP2018-035666

(51) Int. Cl.
*C30B 15/10* (2006.01)
*C03B 20/00* (2006.01)
(Continued)

(52) U.S. Cl.
CPC .............. *C03B 20/00* (2013.01); *C03C 19/00* (2013.01); *C30B 15/10* (2013.01); *C30B 29/06* (2013.01);
(Continued)

(58) Field of Classification Search
CPC ......... C30B 21/00; C30B 19/00; C30B 15/20; C30B 29/06; C03B 2201/02; C03C 2201/02
See application file for complete search history.

(56) References Cited

U.S. PATENT DOCUMENTS

2012/0137965 A1   6/2012   Sudo et al.
2016/0108550 A1*   4/2016   Sudo ....................... C30B 15/10
                                                      65/17.3
(Continued)

FOREIGN PATENT DOCUMENTS

JP         H11278855 A       10/1999
JP         2017001951 A       1/2017
(Continued)

OTHER PUBLICATIONS

International Search Report (ISR) dated Dec. 4, 2018, issued for International application No. PCT/JP2018/040896. (1 page).

*Primary Examiner* — Robert M Kunemund
(74) *Attorney, Agent, or Firm* — Law Office of Katsuhiro Arai

(57) ABSTRACT

A silica glass crucible includes a cylindrical side wall portion, a curved bottom portion, and a corner portion that is provided between the side wall portion and the bottom portion and has a higher curvature than a curvature of the bottom portion, in which a first region provided from a crucible inner surface to a middle in a thickness direction, a second region that is provided outside the first region in the thickness direction and has a different strain distribution from the first region, and a third region that is provided outside the second region in the thickness direction and up to the crucible outer surface and has a different strain distribution from the second region, are provided, and internal residual stresses of the first region and the third (Continued)

region are compressive stresses, whereas an internal residual stress of the second region includes a tensile stress.

20 Claims, 11 Drawing Sheets

(51) Int. Cl.
*C03C 19/00* (2006.01)
*C30B 29/06* (2006.01)
(52) U.S. Cl.
CPC ...... *C03B 2201/02* (2013.01); *C03C 2201/02* (2013.01)

(56) References Cited

U.S. PATENT DOCUMENTS

2016/0313234 A1* 10/2016 Sudo .................. G01L 5/0047
2017/0292901 A1* 10/2017 Kitahara ................ G01N 3/307

FOREIGN PATENT DOCUMENTS

| JP | WO2017110762 | A1 | 6/2018 |
| JP | WO2017110763 | A1 | 6/2018 |
| WO | 2011013695 | A1 | 2/2011 |
| WO | 2017110762 | A1 | 6/2017 |
| WO | 2017110763 | A1 | 6/2017 |

* cited by examiner

[Fig. 1]
(a)
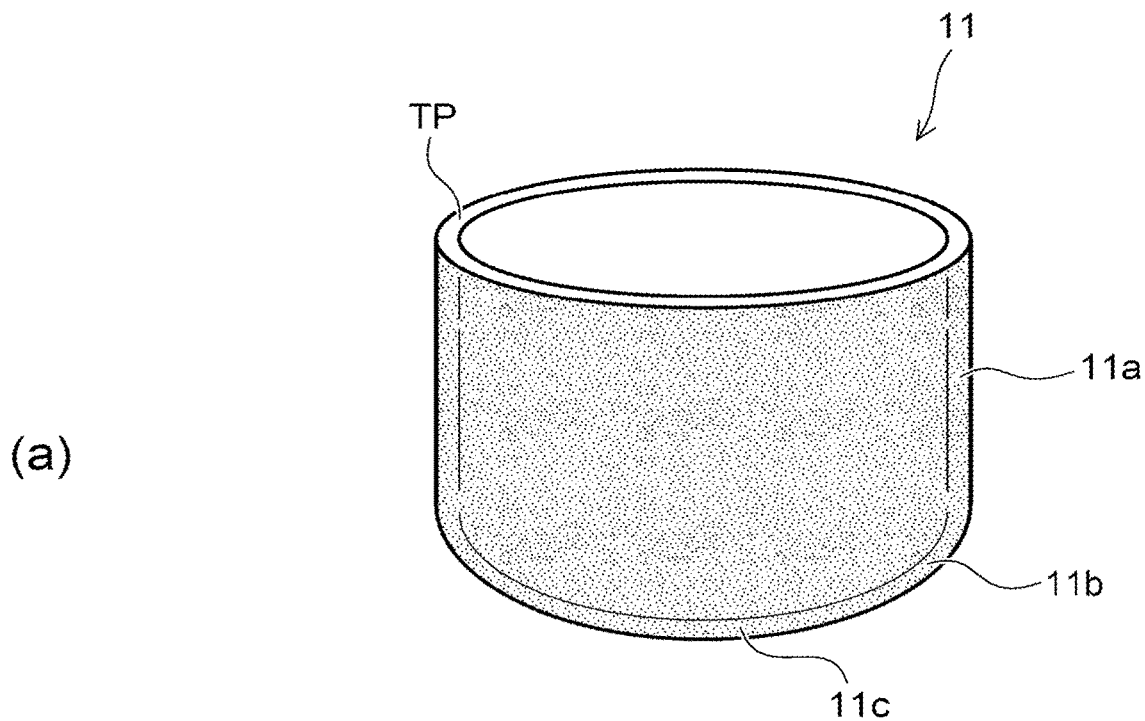
(b)
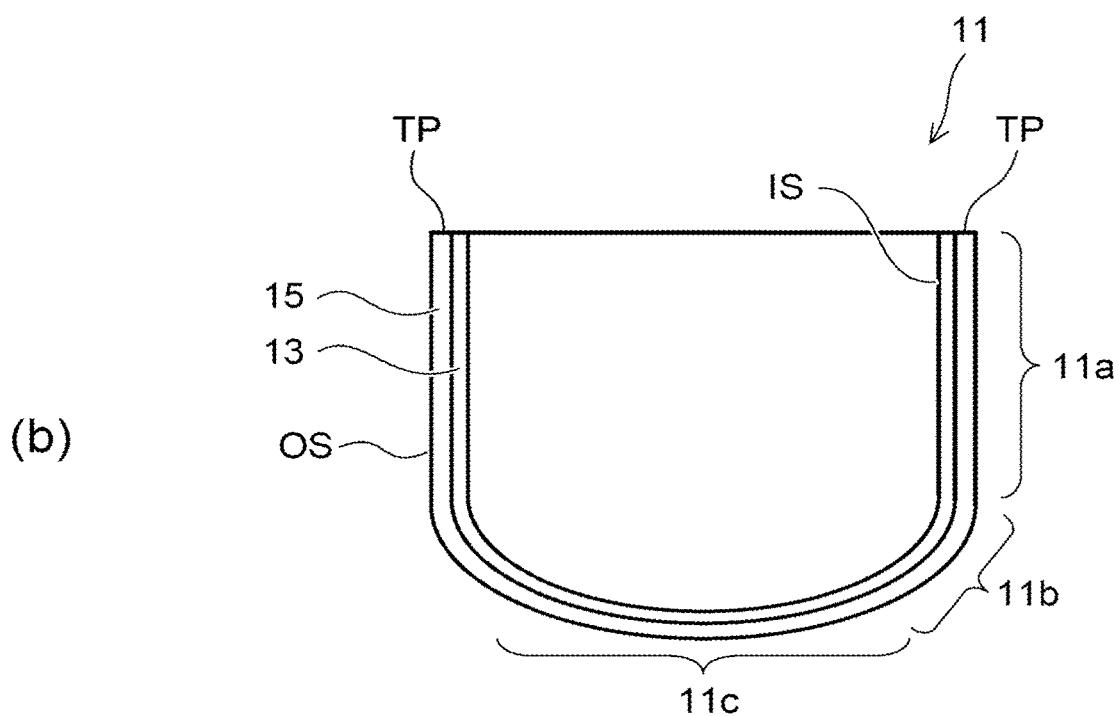

[Fig. 2]
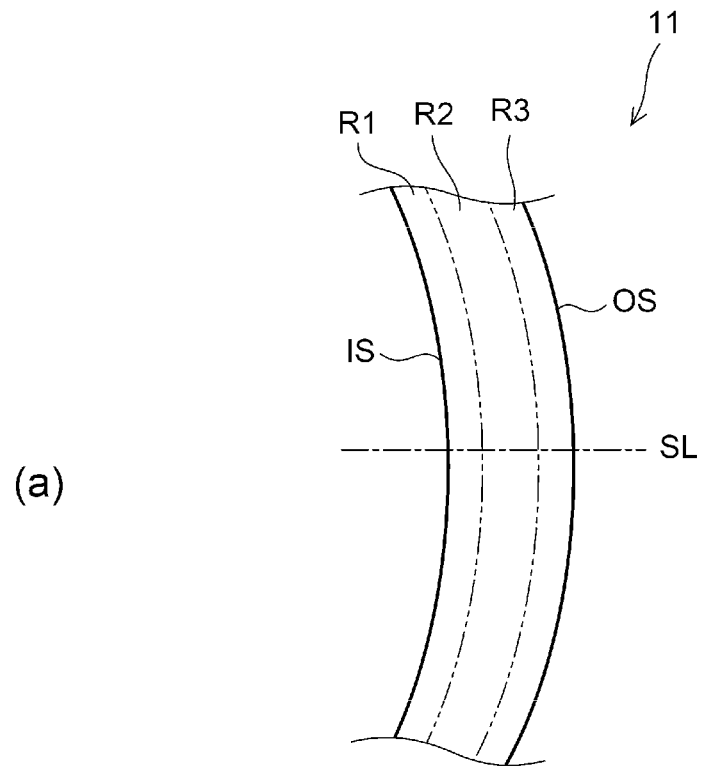
(a)
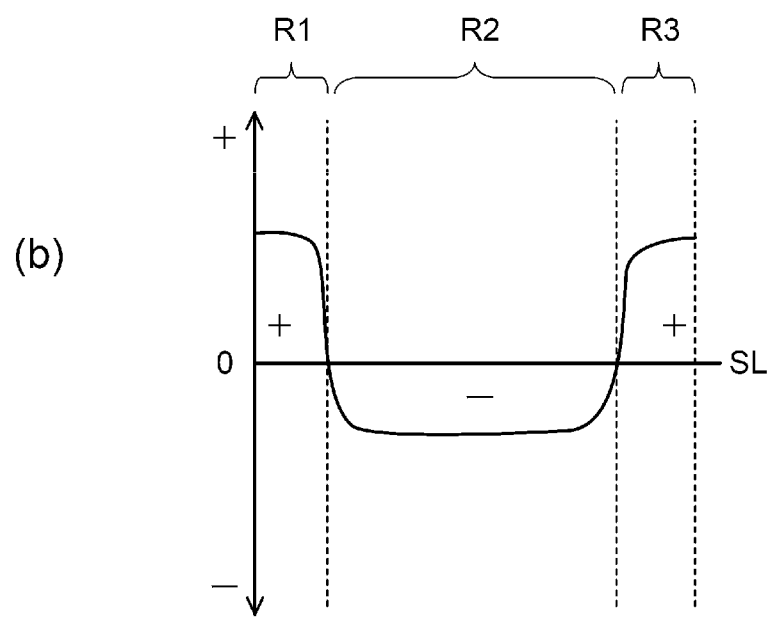
(b)

[Fig. 3]
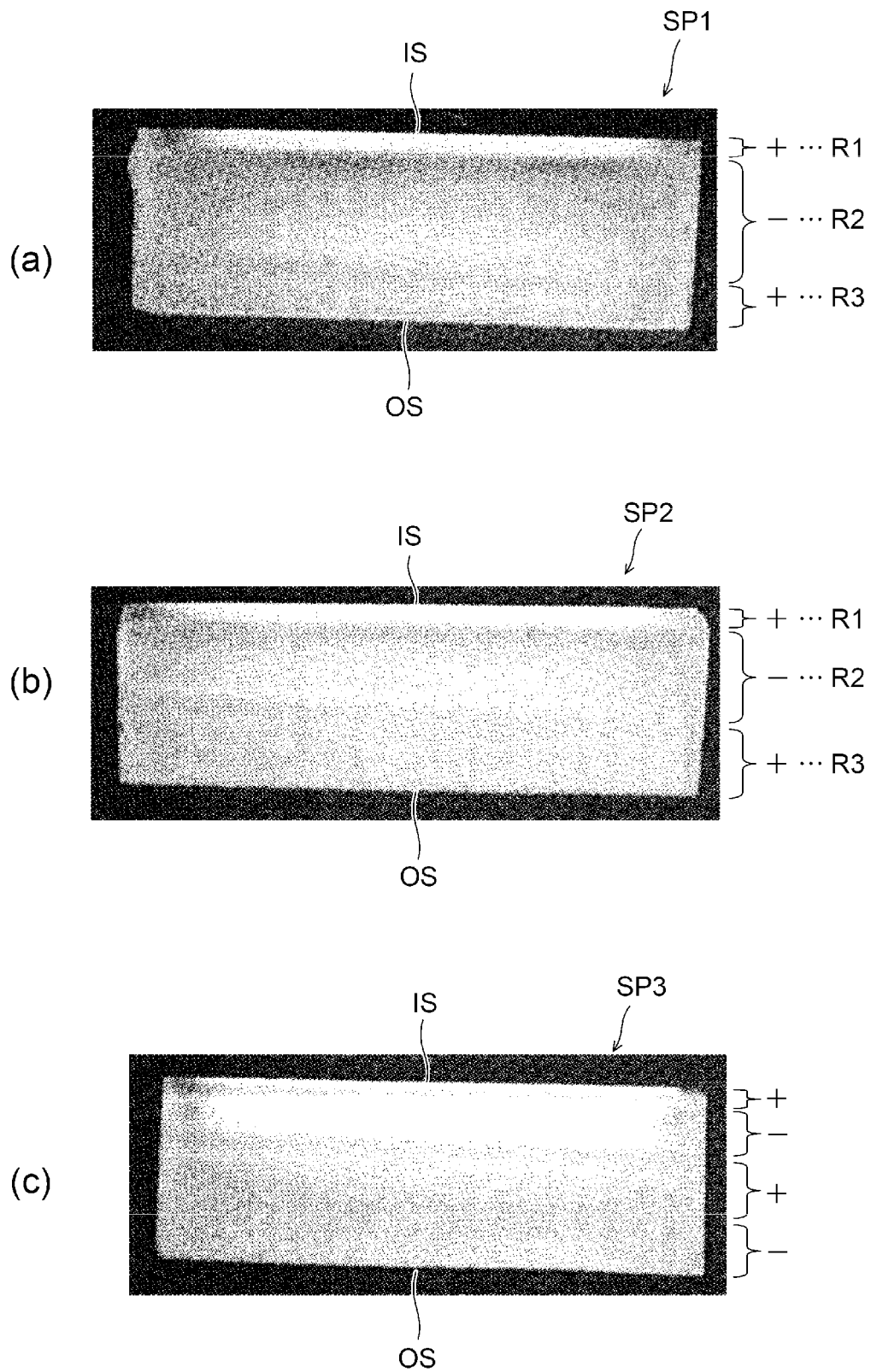

[Fig. 4]
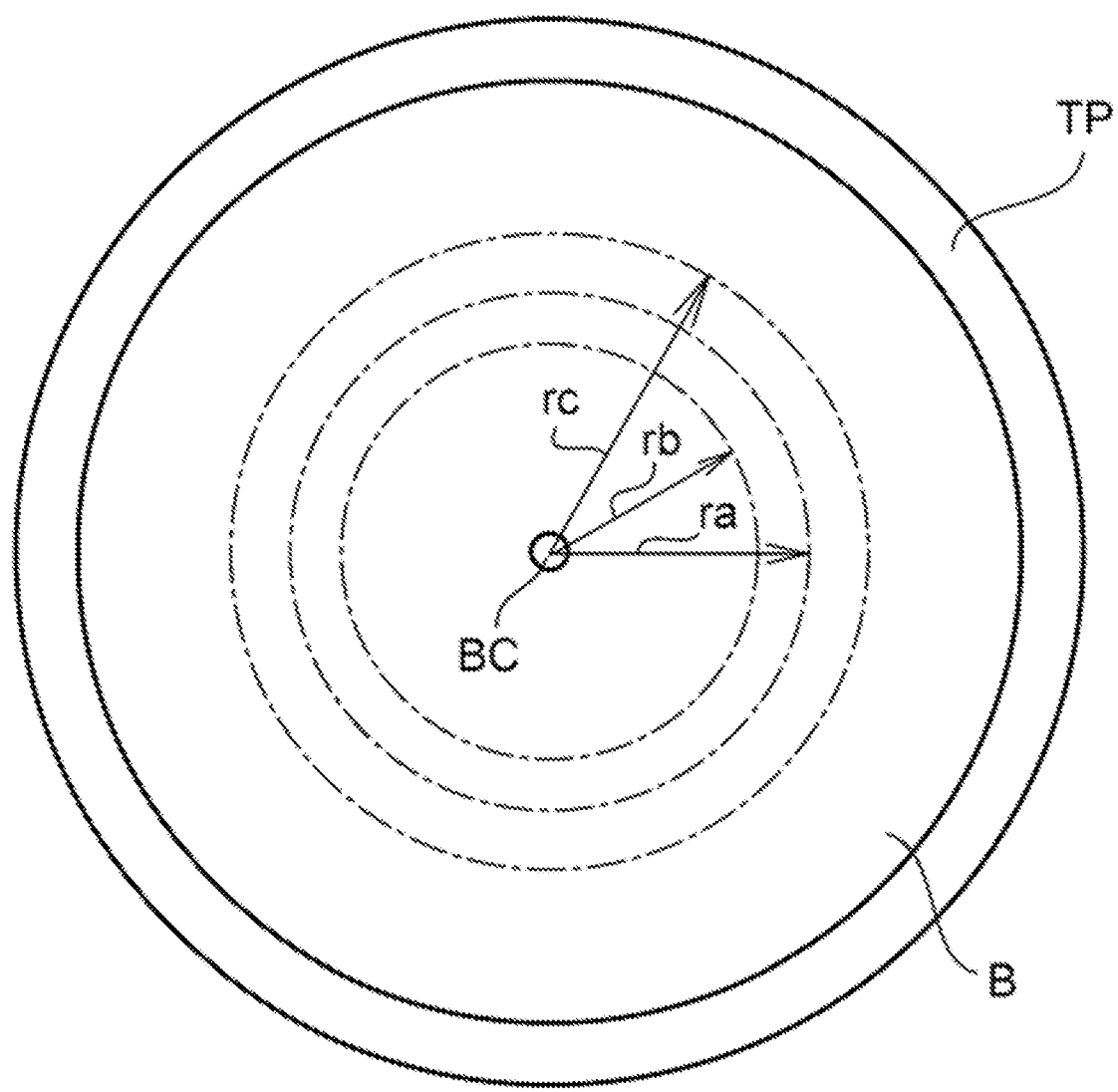

[Fig. 5]
(a) 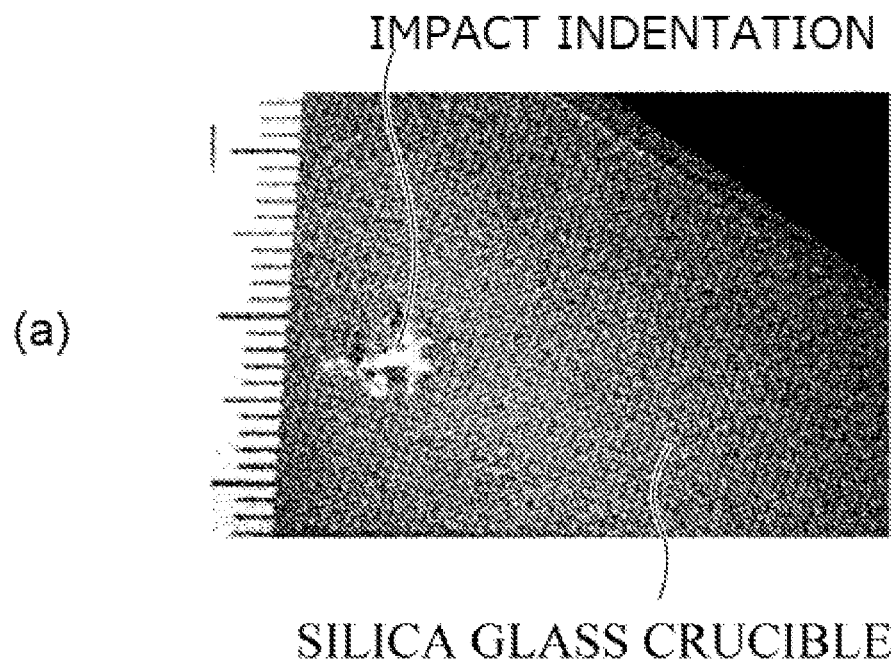
(b) 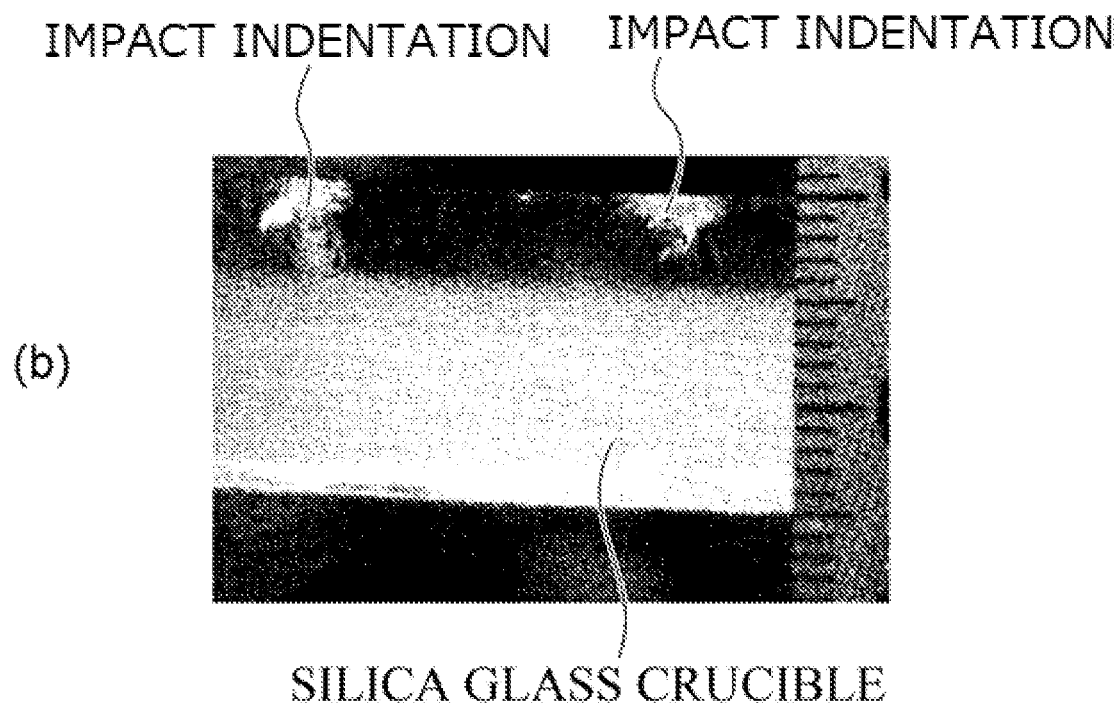

[Fig. 6]
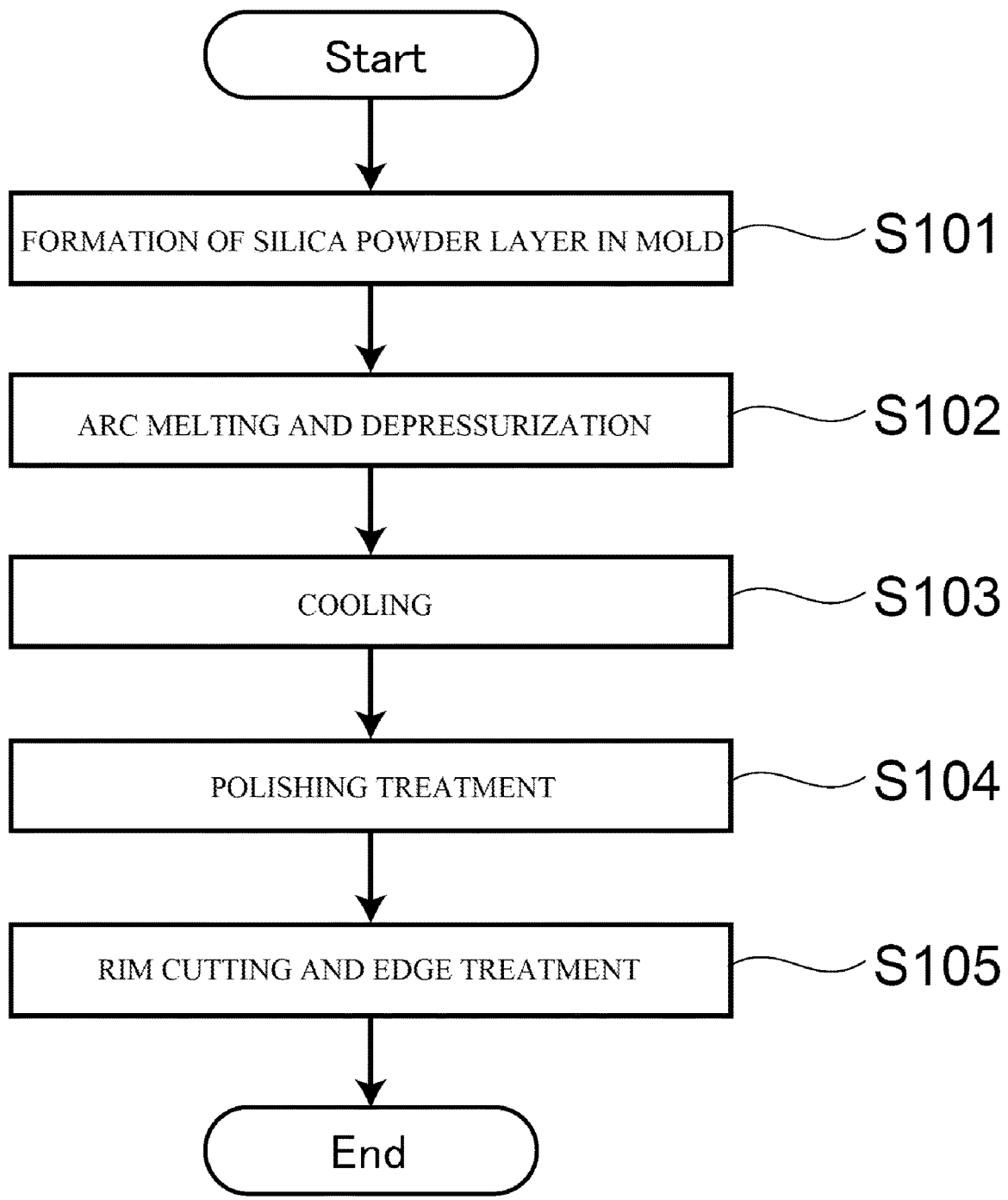

[Fig. 7]
(a)
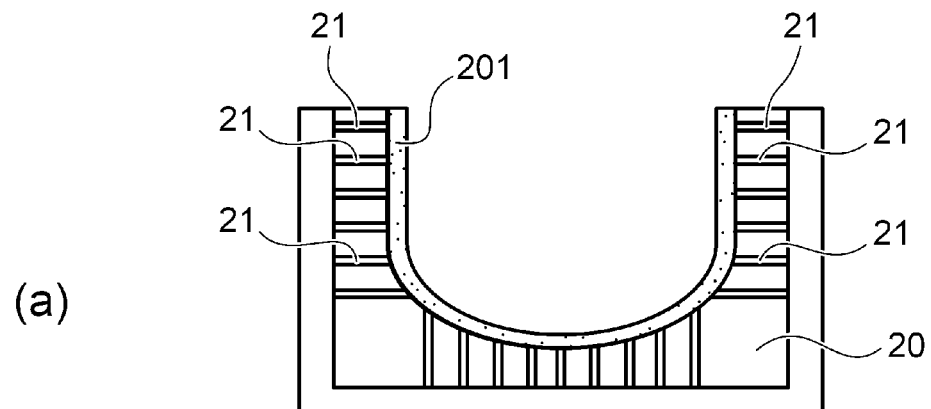
(b)
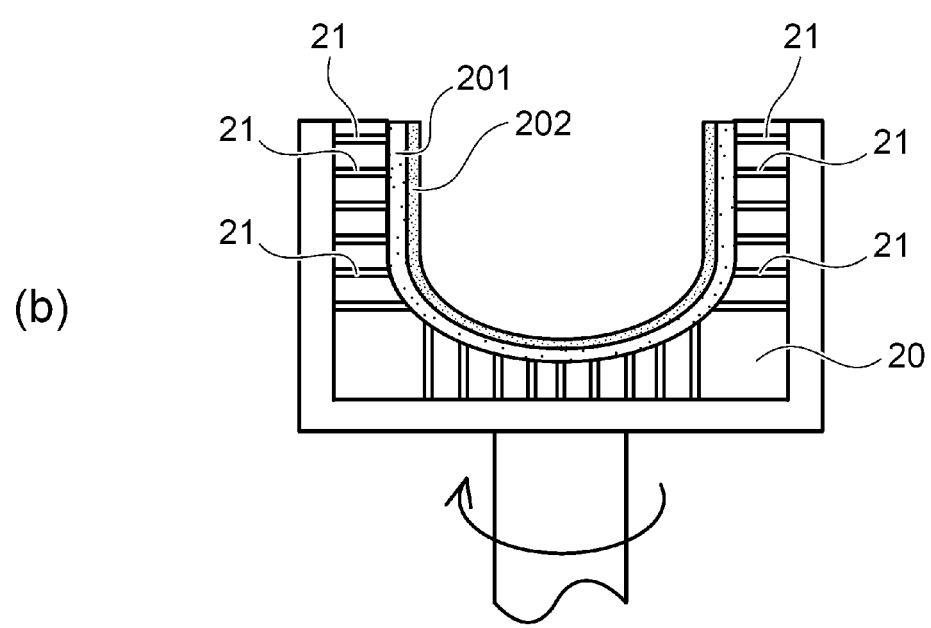

[Fig. 8]
(a)
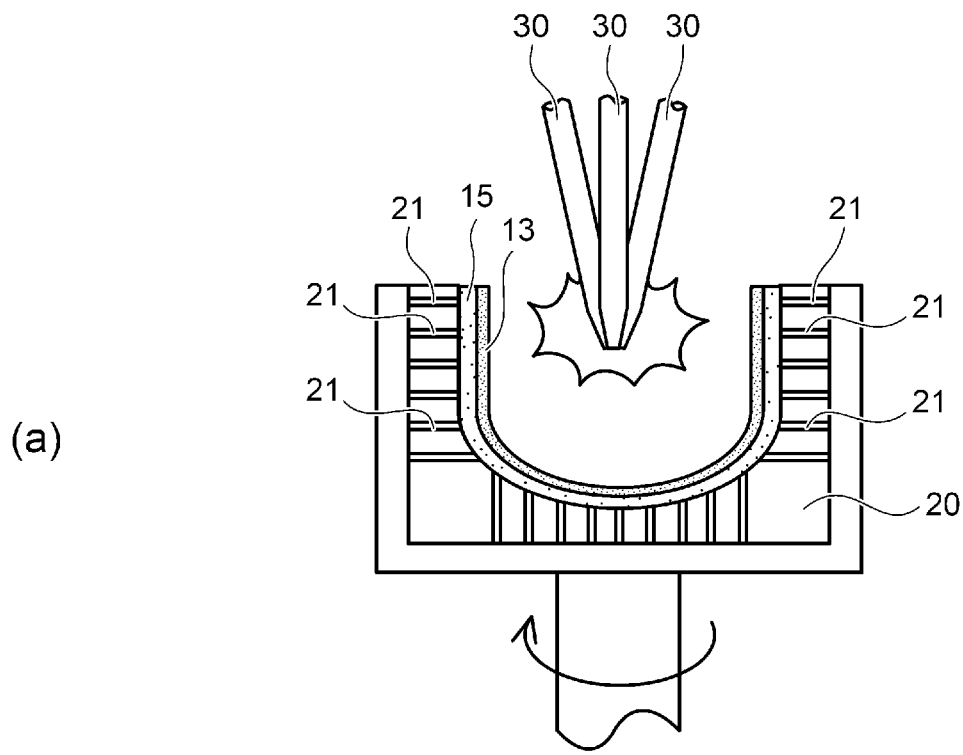
(b)
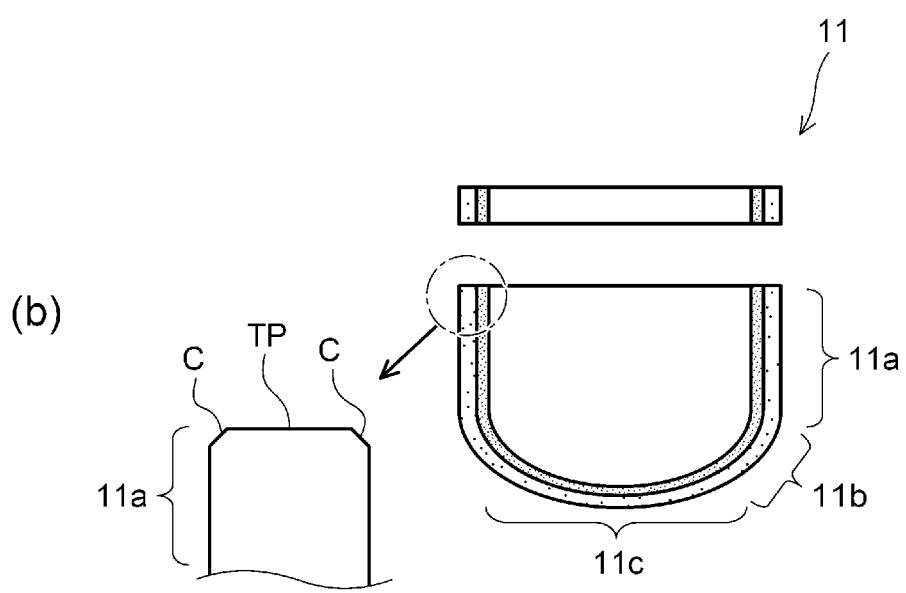

[Fig. 9]
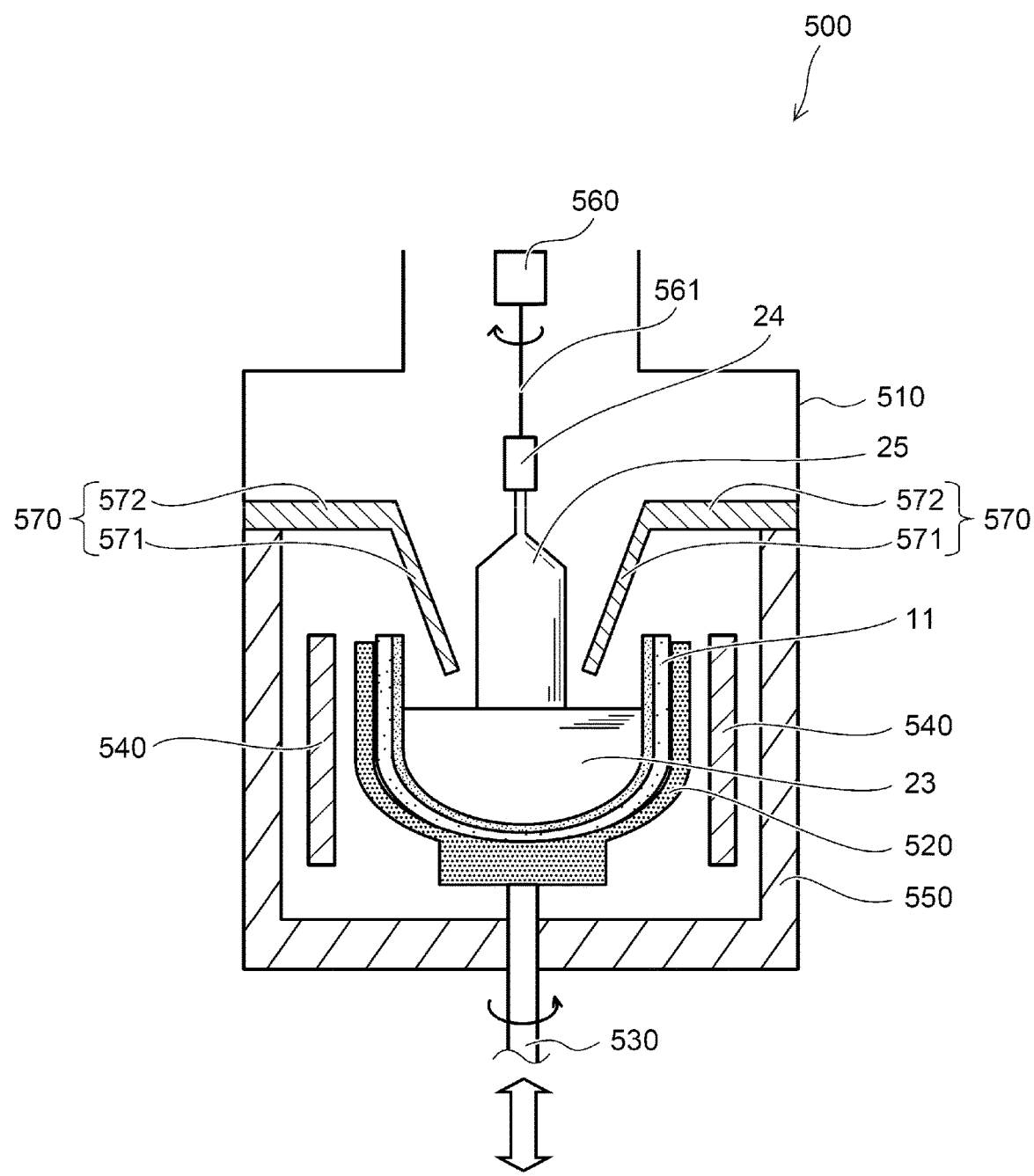

[Fig. 10]
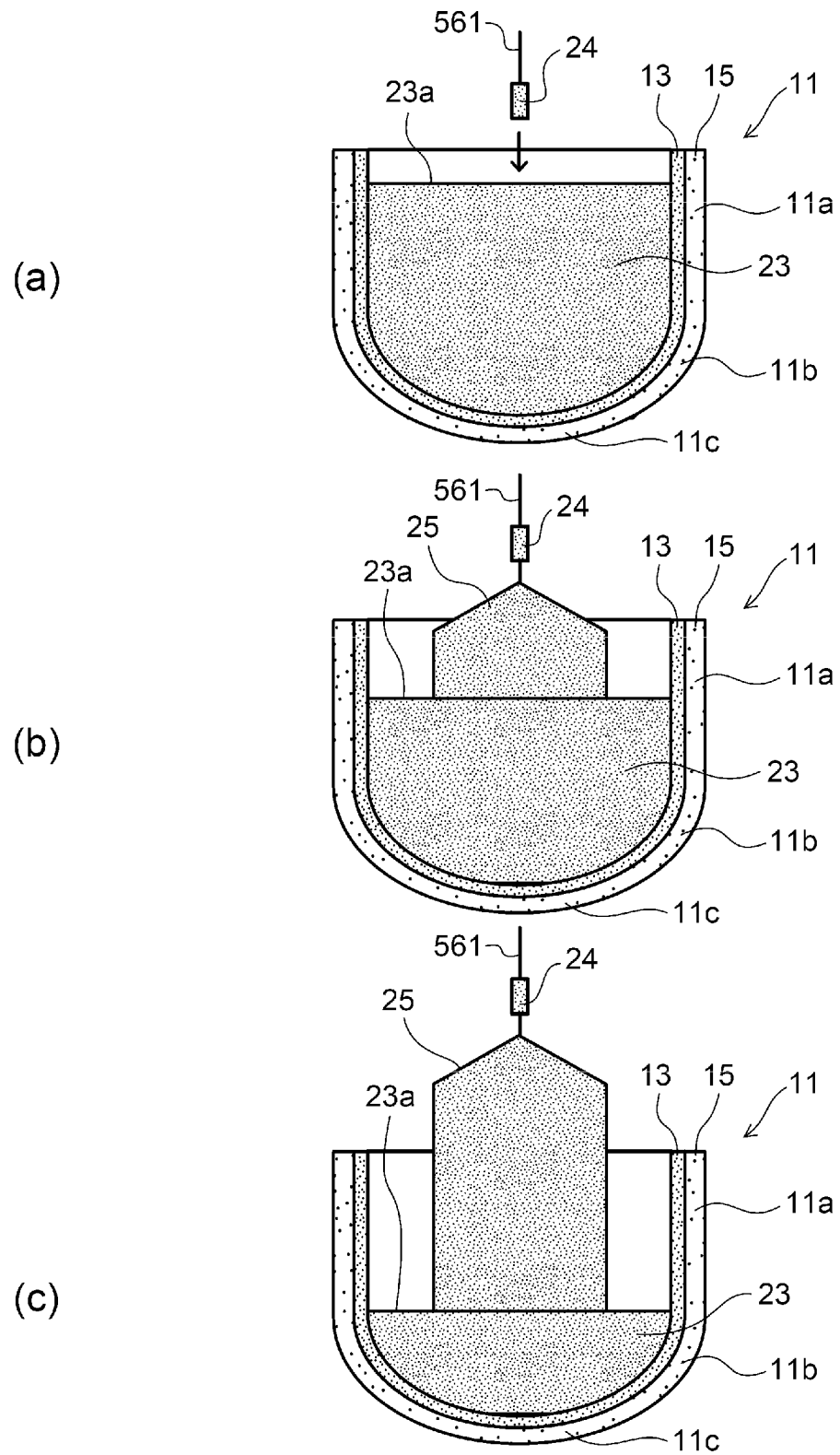

[Fig. 11]
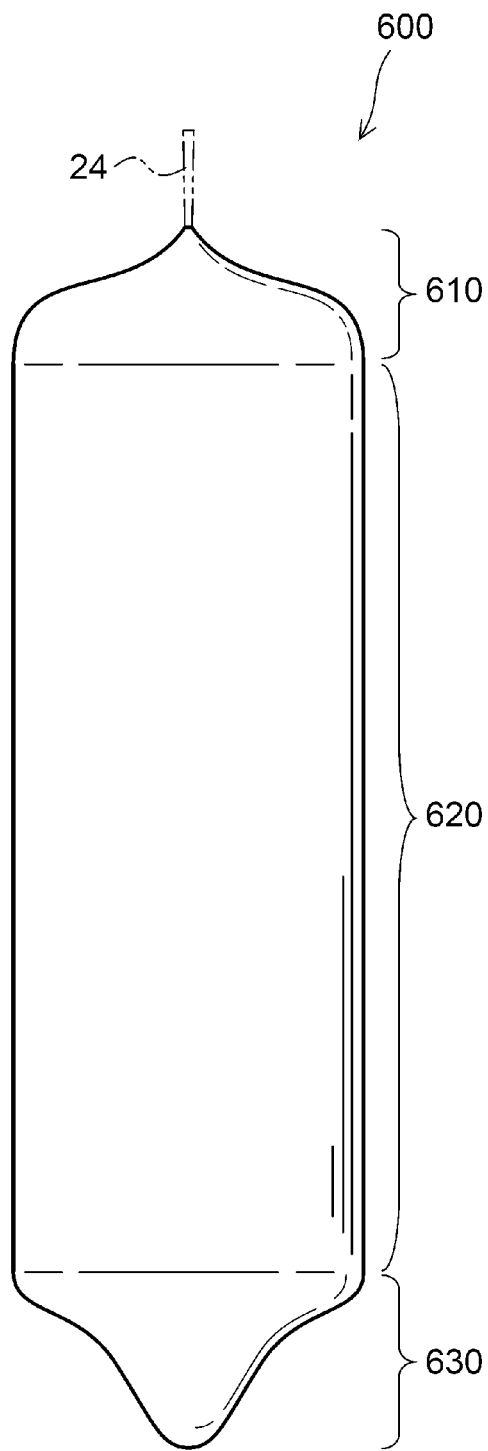

SILICA GLASS CRUCIBLE

CROSS-REFERENCE TO RELATED APPLICATIONS

This application is the U.S. National Phase under 35 U.S.C. § 371 of International Application PCT/JP2018/040896, filed Nov. 2, 2018, which claims priority to Japanese Patent Application No. JP2018-035666, filed Feb. 28, 2018. The International Application was published under PCT Article 21(2) in a language other than English.

TECHNICAL FIELD

The present invention relates to a silica glass crucible.

BACKGROUND ART

Silicon single crystals are manufactured by melting a silicon raw material (polycrystalline silicon) loaded into a silica glass crucible, bringing a seed crystal into contact with the molten polycrystalline silicon, and rotating and pulling up the polycrystalline silicon (CZ method: Czochralski method). The silica glass crucible used in this CZ method is manufactured using a rotational molding method.

That is, a method for manufacturing a silica glass crucible using the rotational molding method includes a silica powder layer-forming step of forming a silica powder layer by depositing silica powder having an average particle diameter of approximately 100 μm to 400 μm on the inside of a rotating carbon mold using a centrifugal force and an arc melting step of arc-melting the silica powder layer from a mold side to form a silica glass layer while depressurizing the silica powder layer.

In the arc melting step, a so-called seal layer is formed by thinly vitrifying an entire outermost surface of the silica powder layer, then, a silica glass layer (hereinafter, also referred to as the "transparent layer") is formed by removing air bubbles by strongly depressurizing the seal layer, and then an air bubble-containing silica glass layer (hereinafter, also referred to as the "non-transparent layer"), in which air bubbles remain, is formed by weakly depressurizing the silica glass layer. Therefore, for example, a bilayer-structured silica glass crucible having the transparent layer on an inner surface side and having the non-transparent layer on an outer surface side is formed.

In such an arc melting step, in the beginning, the silica powder is sintered, volume diffusion occurs, then, furthermore, the temperature increases, grain boundaries disappear, vitrification occurs, and a Si—O—Si network structure is configured. At that time, the rate of sintering or the vitrification rate changes. Specifically, for example, when the silica particles are small or have a shape having the same volume but a large surface area, the sintering rate or the vitrification rate becomes high. When the silica particles are small, spaces between adjacent silica particles are also small, the silica powder is sintered or vitrified at a rate faster than a rate of removing air bubbles by depressurization, and thus air bubbles in a manufactured glass crucible become small, and the number thereof increases. As such, the molecular structure of glass, air bubbles contained, and the like after arc melting are changed by the sintering rate or the vitrification rate.

In addition, molten silica glass is solidified by carrying out a cooling step after the arc melting step. In this cooling step, depending on the cooling rate or cooling method such as blowing of cooling gas, a way of bonding silicon and oxygen (for example, a six-membered ring or an eight-membered ring) or the size of voids between atoms in the bonding structure of silicon and oxygen changes. For example, when the amount of a structure having a large number of members in a ring such as an eight-membered ring becomes high, the number of voids also increases. As such, the bonding state of materials atoms changes intricately depending on a variety of conditions for the melting step, the cooling step, and the like in the manufacturing of a crucible, and thus the distribution of internal residual stresses after the cooling of the silica glass crucible changes, and the strength of the crucible is affected.

Patent Literature 1 discloses a method for manufacturing a silicon single crystal using a silica glass crucible deformation of which is suppressed even when the silica glass crucible is used for a long period of time under a high-temperature conditions. The silica glass crucible used in this method for manufacturing a silicon single crystal includes a transparent layer inside and an air bubble layer outside and includes a compressive stress layer in which a compressive stress remains on an inner surface side of the transparent layer, and a tensile stress layer which is adjacent to the compressive stress layer at a stress change rate of 0.17 MPa/mm or more and 1.5 MPa/mm or less and in which a tensile stress remains.

Patent Literature 2 discloses a silica glass crucible which has a high strength at a high temperature and can be easily removed when fully pulled up. This silica glass crucible includes a silica glass outer layer provided on an outer surface side of the crucible, a silica glass inner layer provided on an inner surface of the crucible, and a silica glass intermediate layer provided between the silica glass outer layer and the silica glass inner layer.

Patent Literature 3 discloses a silica glass crucible which suppresses the expansion of air bubbles present in the silica glass crucible and from which a high single crystallization rate can be obtained. In this silica glass crucible, a compressive stress as high as half of a break strength of a non-transparent layer is provided in a transparent layer.

BACKGROUND ART LITERATURE

Patent Literature

Patent Literature 1: Japanese Patent Application Laid-Open No. 2017-001951
Patent Literature 2: International Patent Laid-open No. WO2011/013695
Patent Literature 3: Japanese Patent Application Laid-Open No. H11-278855

SUMMARY OF INVENTION

Problems to be Solved by the Invention

The quality of a silica glass crucible has a close relationship with the quality of a silicon single crystal (silicon ingot) in the case of pulling up the silicon single crystal using the silica glass crucible (for example, a CZ method). For example, fine debris (particles peeled from the crucible) from the breakage or collapse of chips or air bubbles on the inner surface of the silica glass crucible drops into a silicon melt. The infusion of this debris into the silicon ingot leads to dislocation generation of the silicon ingot.

In addition, at the time of loading a silicon raw material into the silica glass crucible, there is a case where the silicon raw material (polycrystalline silicon) strongly impacts a crucible inner surface. When the strength of the crucible inner surface is insufficient, there is a concern that the crucible inner surface may crack or break at the time of loading the silicon raw material.

In addition, there is a possibility that, at the time of transporting the silica glass crucible, a substance of some kind may hit a crucible outer surface, and, when the strength of the crucible outer surface is insufficient, there is a case where a crack is generated or breakage is generated in the silica glass crucible.

Furthermore, when the surface roughness of the crucible outer surface becomes equal to or less than a predetermined value, in a CZ pull-up device, a friction force between the silica glass crucible and a carbon susceptor decreases, and the silica glass crucible deforms during CZ pull-up, which acts as a cause of degrading the quality (for example, single crystallization rate) of a silicon single crystal.

An object of the present invention is to provide a silica glass crucible capable of sufficiently ensuring the strength of the crucible inner surface and the outer surface.

Means for Solving the Problems

An aspect of the present invention is a silica glass crucible including a cylindrical side wall portion, a curved bottom portion, and a corner portion that is provided between the side wall portion and the bottom portion and has a greater curvature than a curvature of the bottom portion, in which a first region provided from a crucible inner surface to a middle in a thickness direction, a second region that is provided outside the first region in the thickness direction and has a different strain distribution from the first region, and a third region that is provided outside the second region in the thickness direction and up to the crucible outer surface and has a different strain distribution from the second region, are provided, internal residual stresses of the first region and the third region are compressive stresses, and an internal residual stress of the second region includes a tensile stress.

According to the above-described configuration, as the internal residual stresses of the silica glass crucible, compressive stresses are present respectively on the inner surface side (first region) and on the outer surface side (third region) in the thickness direction, and a tensile stress is present in the middle portion (second region), and thus it is possible to sufficiently ensure strength on the crucible inner surface and on the crucible outer surface respectively.

In the silica glass crucible, the internal residual stress of the second region may not include a compressive stress, and the second region may be provided adjacent to each of the first region and the third region. In such a case, a three-layer structure of a stress distribution having internal residual stresses of a compressive stress, a tensile stress, and a compressive stress in the thickness direction of the silica glass crucible is configured.

In the silica glass crucible, a thickness of the first region in the thickness direction may be 1 mm or more and preferably 3 mm or more from the crucible inner surface. In such a case, it is possible to ensure a sufficient strength even when a polycrystalline silicon, which is a material for pulling up a silicon single crystal, impacts the crucible inner surface when loading the polycrystalline silicon into the silica glass crucible.

In the silica glass crucible, a thickness of the third region in the thickness direction may be 1 mm or more and preferably 5 mm or more from the crucible outer surface. In such a case, it is possible to ensure sufficient strength even when a pressure of some kind is applied to the crucible outer surface, such as during transportation of the silica glass crucible.

In the silica glass crucible, at the time of impacting the crucible inner surface by an impact at a force of 300 Newtons (N), a diameter of an indentation on the crucible inner surface may be 5 mm or less and preferably 1 mm or less. In such a case, it is possible to ensure sufficient strength even when a polycrystalline silicon, which is a material for pulling up a silicon single crystal, impacts the crucible inner surface when loading the polycrystalline silicon into the silica glass crucible.

In the silica glass crucible, a surface roughness of the crucible outer surface may be 10 μm or more and 50 μm or less in terms of Ra (arithmetic average roughness: JIS (Japanese Industrial Standards) B0601-2001). In such a case, it is possible to suppress the generation of a base point of cracks or breakage attributed to a height difference of unevenness on the crucible outer surface, and it becomes possible to optimize a friction force between the silica glass crucible and a carbon susceptor by an appropriate degree of unevenness.

Effects of the Invention

According to the present invention, it becomes possible to provide a silica glass crucible capable of sufficiently ensuring strength of the inner surface and the outer surface of the crucible.

BRIEF DESCRIPTION OF THE DRAWINGS

FIGS. 1 (a) and (b) are schematic views for showing an example of a silica glass crucible;

FIGS. 2 (a) and (b) are views for describing regions in the silica glass crucible;

FIG. 3 (a) to (c) are views for showing examples of measurement results of internal residual stresses in the silica glass crucible;

FIG. 4 is a view for describing impact locations by an automatic center punch;

FIGS. 5 (a) and (b) are views for showing examples of impact indentations;

FIG. 6 is a flowchart schematically showing steps for manufacturing the silica glass crucible;

FIGS. 7 (a) and (b) are schematic views for describing a method for manufacturing the silica glass crucible;

FIGS. 8 (a) and (b) are schematic views for describing the method for manufacturing the silica glass crucible;

FIG. 9 is a schematic view showing an overall configuration of a pull-up device that is a device for manufacturing a silicon single crystal;

FIG. 10 (a) to (c) are schematic views for describing a method for manufacturing a silicon single crystal using the silica glass crucible according to an embodiment of the present invention; and FIG. 11 is a schematic view for exemplifying an ingot of a silicon single crystal.

MODE FOR CARRYING OUT THE INVENTION

Hereinafter, an embodiment of the present invention will be described on the basis of drawings. In the following description, similar members will be given a similar reference sign, and the description of a member once described will be appropriately omitted.

<Silica Glass Crucible>

FIGS. 1(a) and (b) are schematic views for exemplifying a silica glass crucible.

FIG. 1(a) shows a perspective view of a silica glass crucible 11, and FIG. 1(b) shows a cross-sectional view of the silica glass crucible 11.

The silica glass crucible 11 has a corner portion 11b having a relatively high curvature, a cylindrical side wall portion 11a having an edge portion that opens on an upper surface, and a mortar-like bottom portion 11c defined by a straight line or a curved line having a relatively low curvature in a cross section.

In the present embodiment, the corner portion 11b is a portion connecting the side wall portion 11a and the bottom portion 11c and refers to a portion from a point at which a tangent line to the curved line of the corner portion 11b overlaps the side wall portion 11a of the silica glass crucible 11 to a point at which the corner portion has a tangent line common with the bottom portion 11c. In other words, a point at which the side wall portion 11a of the silica glass crucible 11 begins to curve is the boundary between the side wall portion 11a and the corner portion 11b. Furthermore, a portion in which the curvature of a bottom of the silica glass crucible 11 remains substantially constant is the bottom portion 11c, and a point at which the curvature begins to change as the distance from the center of the bottom of the silica glass crucible 11 increases is the boundary between the bottom portion 11c and the corner portion 11b.

In a thickness direction of the silica glass crucible 11 (also referred to as the thickness direction), a transparent layer 13 is provided on a crucible inner surface (hereinafter, also referred to as the "inner surface IS") side, and a non-transparent layer 15 is provided on a crucible outer surface (hereinafter, also referred to as the "outer surface OS") side.

The transparent layer 13 is a layer substantially including no air bubbles. Here, "substantially including no air bubbles" means that the air bubble content rate and the air bubble size are so small that the single crystallization rate of a silicon single crystal does not decrease due to air bubbles. For example, the air bubble content rate of the transparent layer 13 is 0.1% or less, and the average diameter of air bubbles is 100 µm or less.

The transparent layer 13 preferably includes synthetic silica glass on the inner surface IS side. The synthetic silica glass refers to, for example, silica glass manufactured by melting a raw material synthesized by the hydrolysis of a silicon alkoxide. Generally, synthetic silica has a property of a low concentration of metallic impurities and a high concentration of an OH group, compared with natural silica. For example, the content of metallic impurities included in synthetic silica is less than 0.05 ppm, and the content of an OH group is 30 ppm or more. However, synthetic silica to which a metallic impurity such as Al is added is also known, and thus whether or not certain silica is synthetic silica should not be determined on the basis of one element, but should be comprehensively determined on the basis of a plurality of elements. As such, synthetic silica glass includes less impurities compared with natural silica and is thus capable of preventing an increase in an impurity leaching into a silicon melt from the crucible, and capable of increasing the silicon single crystallization rate.

In the non-transparent layer 15, a number of air bubbles are present. The non-transparent layer 15 is a layer that appears in a white-turbid state due to the air bubbles. The non-transparent layer 15 is preferably made of natural silica glass. The natural silica glass refers to silica glass manufactured by melting a natural raw material such as a natural quartz crystal or silica. Generally, natural silica has a characteristic of a high concentration of metallic impurities and a low concentration of an OH group compared with synthetic silica. For example, the content of Al included in natural silica is 1 ppm or more, the contents of alkali metals (Na, K, and Li) are respectively 0.1 ppm or more, and the content of an OH group is less than 60 ppm.

It should be noted that whether or not certain silica is natural silica should not be determined on the basis of one element, but should be comprehensively determined on the basis of a plurality of elements. Natural silica has higher viscosity at a high temperature compared with synthetic silica and is thus capable of increasing the heat-resistance strength of the entire crucible. In addition, natural raw material is less expensive than synthetic silica and is more advantageous in terms of costs.

FIGS. 2(a) and (b) are views for describing regions in the silica glass crucible.

FIG. 2(a) shows an enlarged cross-sectional view of a part seen from an upper end surface TP side of the silica glass crucible 11 shown in FIG. 1, and FIG. 2(b) shows an example of an internal residual stress along a line SL in the thickness direction in FIG. 2(a).

As shown in FIG. 2(a), the silica glass crucible 11 according to the present embodiment has a first region R1 provided from the inner surface IS to a middle in the thickness direction, a second region R2 provided outside the first region R1 in the thickness direction, and a third region R3 that is provided outside the second region R2 in the thickness direction and up to the outer surface OS.

As shown in FIG. 2(b), in the present embodiment, an internal residual stress of the first region R1 is a compressive stress, an internal residual stress of the second region R2 is a tensile stress, and an internal residual stress of the third region R3 is a compressive stress. It should be noted that in FIG. 2(b), the horizontal axis indicates positions on the line SL in the thickness direction with the inner surface regarded as an origin point "0", and the vertical axis indicates the intensities of internal residual stresses with the (+) side indicating compressive stresses and the (−) side indicating tensile stresses. It should be noted that in the present embodiment, unless particularly otherwise described, a compressive stress and a tensile stress are regarded as internal residual stresses.

In the example shown in FIG. 2, the second region R2 does not include any compressive stress, and the second region R2 is adjacent to the first region R1 and the third region R3 respectively. Therefore, a three-layer structure of the stresses of the first region R1, the second region R2, and the third region R3 in the thickness direction is configured.

In the silica glass crucible 11, the first region R1, the second region R2, and the third region R3 continue in a circumferential direction. That is, in each of the first region R1, the second region R2, and the third region R3, a significant stress change is not generated at least in the circumferential direction (substantially uniform stress distribution).

In the silica glass crucible 11, a compressive stress is present in the first region R1, whereby the strength of the inner surface IS improves. For example, in the case of pulling up a silicon single crystal using the silica glass crucible 11, polycrystalline silicon is loaded as a material into the silica glass crucible 11. At this time, impact is likely to be exerted on the inner surface IS of the silica glass crucible 11. A compressive stress is present in the first region R1, whereby sufficient resistance to the impact at the time of loading polycrystalline silicon is obtained.

In addition, in the silica glass crucible 11, a compressive stress is present in the third region R3, whereby the strength of the outer surface OS improves. Therefore, it is possible to ensure a sufficient strength even when a pressure of some kind is applied to the outer surface OS such as during the transportation of the silica glass crucible 11.

FIGS. 3(a) to (c) are views for exemplifying the measurement results of internal residual stresses in the silica glass crucible.

FIGS. 3(a) to (c) show the results of internal residual stresses measured by a sensitive color method from samples SP1 to SP3 obtained by cutting out parts of a silica glass crucible.

Here, the sensitive color method refers to a method in which two polarizing plates are placed to be orthogonal to each other, and a change in the color of a substance imparting an optical path difference such as glass having a strain caused when the glass is inserted between the polarizing plates, thereby observing the presence or absence of an internal stress and the direction of the stress (tensile stress/compressive stress). In the sensitive color method, the background color becomes red-violet, and, in a case where no internal stress is present in an observation subject, the same color as the background color is observed. On the other hand, in a case where an internal stress is present in the observation subject, a change in color to blue or orange depending on the exertion direction of a force such as a tensile stress/a compressive stress is observed.

The sample SP1 shown in FIG. 3(a) and the sample SP2 shown in FIG. 3(b) are samples cut out from the silica glass crucible 11 according to the present embodiment, and the sample SP3 shown in FIG. 3(c) is a sample cut out from a silica glass crucible according to a reference example.

The respective samples SP1 to SP3 are cut out from corresponding portions (150 mm from the upper end surface TP in a height direction) of the respective silica glass crucibles.

In the respective drawings, regions from which a compressive stress is measured are given "+", and regions from which a tensile stress is measured are given "−".

In the samples SP1 and SP2 shown in FIGS. 3(a) and (b), internal residual stresses change in order of a compressive stress "+", a tensile stress "−", and a compressive stress "+" from the inner surface IS through the outer surface OS in the thickness direction. A region with the compressive stress on the inner surface IS side is the first region R1, a region with the tensile stress is the second region R2, and a region with the compressive stress on the outer surface OS side is the third region R3.

In the sample SP3 shown in FIG. 3(c), the internal residual stresses change in order of a compressive stress "+", a tensile stress "−", a compressive stress "+", and a tensile stress "−" from the inner surface IS through the outer surface OS in the thickness direction.

On the silica glass crucibles from which the samples SP1 to SP3 are to be cut out, a strength (breakage) test is carried out in advance. The sizes of the silica glass crucibles are 32 inches in outer diameter (approximately 81.2 cm in outer diameter).

In the strength test, whether or not a breakage occurs at the time of imparting an impact using an automatic center punch was observed.

Here, the test using the automatic center punch is a method disclosed in, for example, International Patent Laid-open No. WO2016/047694. That is, the automatic center punch includes a shaft made of a rod-shaped metal member having a sharp front end, a hammer portion provided at the rear end portion of the shaft, a coil spring biasing the shaft in the rear end direction thereof, a coil spring provided at the rear end portion of the hammer portion, and a substantially cylindrical case accommodating the above-described members. The automatic center punch is capable of instantly adding a large load to a subject brought into contact with the front-end portion of the shaft.

FIG. 4 is a view for describing impact positions. That is, as shown in FIG. 4, the impact positions are positions radii ra, rb, and rc away from a center (BC) of a bottom portion B on the crucible inner surface when viewing the silica glass crucible from the upper end surface TP. The load of the automatic center punch, at which the impact is imparted, is 300 Newton (N).

The testing method is as described below.

(1) An impact is sequentially imparted to 16 points at positions of the radius ra=200 mm away.

(2) In a case where no breakage occurs in (1), an impact is sequentially imparted to 16 points at positions of the radius rb=150 mm away.

(3) In a case where no breakage occurs in (2), an impact is sequentially imparted to 16 points at the positions of the radius rc=250 mm away.

As a result of this test, in the silica glass crucibles that were the origins of the samples SP1 and SP2, no breakage occurred. On the other hand, in the silica glass crucible that was the origin of the sample SP3, a breakage occurred when the impact was imparted at the positions of 200 mm away from the center BC of the bottom portion B.

From the test result, it is found that, in a case where regions with a compressive stress are present on the inner surface IS side and the outer surface OS side of the silica glass crucible respectively, it is possible to ensure a sufficient strength. Therefore, it becomes important that regions with a compressive stress are present on the inner surface IS side and the outer surface OS side as in the samples SP1 and SP2 in terms of obtaining a sufficient strength of the silica glass crucible.

The above-described distribution of the internal residual stresses in the thickness direction changes depending on the heat history attributed to arc melting, the cooling rate, the heating pattern, or the like at the time of manufacturing the silica glass crucible. It is possible to provide regions with a compressive stress to the inner surface IS side and the outer surface OS side by controlling the heat history.

FIGS. 5(a) and (b) are views for exemplifying impact indentations by the automatic center punch.

FIG. 5(a) shows an example of an impact indentation seen in a direction orthogonal to the inner surface, and FIG. 5(b) shows an example of an impact indentation seen in a direction orthogonal to the thickness direction.

As shown in FIG. 5(a), the size of the impact indentation is approximately 5 mm. Here, the size of an indentation generated by loading polycrystalline silicon into the silica glass crucible is approximately 1 mm. In addition, as shown in FIG. 5(b), the depth of the impact indentations is approximately 3 to 4 mm. Here, the depth of the indentation generated by loading polycrystalline silicon into the silica glass crucible is approximately 2 mm.

As described above, the impact by the automatic center punch at 300 N is sufficiently greater than the indentation provided at the time of loading polycrystalline silicon. Therefore, it can be said that, in the silica glass crucibles (the present embodiment) that are the origins of the samples SP1 and SP2 in which no breakage occurred according to the above-described test results, it is possible to sufficiently ensure strength at the time of loading polycrystalline silicon.

From the above-described test results, when the automatic center punch impacts the inner surface IS at a force of 300 N, the diameter of an indentation on the inner surface IS needs to be 5 mm or less and preferably 1 mm or less. In addition, in the silica glass crucible 11 according to the present embodiment, the thickness in the thickness direction of the first region R1 in which a compressive stress is present needs to be 1 mm or more from the inner surface IS, preferably 3 mm or more, and more preferably the entire thickness of the transparent layer. In such a case, when polycrystalline silicon is loaded into the silica glass crucible 11, even in a case where the polycrystalline silicon impacts the crucible inner surface, indentations are confined in the first region R1, the generation of a crack from the indentation as a base point is suppressed, and a sufficient strength can be ensured.

In addition, in the silica glass crucible 11 of the present embodiment, the thickness in the thickness direction of the third region R3 needs to be 1 mm or more from the outer surface OS and preferably 5 mm or more. In such a case, even when a pressure of some kind is applied to the crucible outer surface such as during the transportation of the silica glass crucible, and an impact is exerted thereon, indentations are confined in the third region R3, the generation of a crack from the indentation as a base point is suppressed, and a sufficient strength can be ensured.

In a large crucible in which the outer diameter of the silica glass crucible 11 is 32 inches or more or an ultra-large crucible in which the outer diameter is 40 inches or more, the influence of cleavage, breakage, peeling, or the like attributed to the distribution of internal residual stresses in the thickness direction of the silica glass crucible 11 is significant. Particularly, when the crucible outer diameter is increased, the increase rate of the thickness becomes high compared with the increase rate of the outer diameter. That is, there is a tendency that the thickness becomes relatively thick compared with an increase in the crucible outer diameter. Therefore, as the crucible outer diameter increases, the stress distribution in the thickness direction becomes more complicated, and it is more likely that a lack of the strength may be caused. Providing a compressive stress to the first region R1 on the inner surface IS side and the third region R3 on the outer surface OS side in the thickness direction of the silica glass crucible 11 as in the present embodiment is particularly effective for improving the strengths of large or ultra-large crucibles.

In addition, in the silica glass crucible 11 according to the present embodiment, the surface roughness of the outer surface OS needs to be 10 µm or more and 50 µm or less in terms of Ra (arithmetic average roughness). In addition, the surface roughness of the outer surface OS needs to be 80 µm or more and 200 µm or less in terms of Rz (maximum height). In the present embodiment, Ra (arithmetic average roughness) and Rz (maximum height) are values measured on the basis of JIS (Japanese Industrial Standards) B0601-2001. When the unevenness (surface roughness) of the outer surface OS is above the above-described upper limit, the unevenness of the outer surface OS becomes severe, and a base point of cracking or breakage is likely to be generated from a recess portion due to the height difference of the unevenness. To the outer surface OS of the silica glass crucible 11, an external force of some kind is likely to be exerted during transportation of the silica glass crucible 11 or the like. Therefore, when the surface roughness of the outer surface OS is regulated as described above, it is possible to suppress the generation of a base point of cracking or breakage attributed to the height difference of the unevenness of the outer surface OS.

On the other hand, when the surface roughness of the outer surface OS is below the above-described lower limit, in a CZ pull-up device, the displacement of the silica glass crucible 11 is likely to occur in a carbon susceptor, and the deformation such as subduction of the side wall portion 11a is likely to occur when the silica glass crucible is used at a high temperature. That is, when the surface roughness of the outer surface OS is too small, a friction force between the outer surface OS and the carbon susceptor decreases, and the silica glass crucible 11 is likely to deform during CZ. Therefore, Rz (maximum height) of the outer surface OS is set to 80 µm or more, whereby the friction force between the silica glass crucible 11 and the carbon susceptor becomes high to some extent due to the appropriate unevenness of the outer surface OS. Therefore, it becomes easy to suppress the deformation of the silica glass crucible 11 during CZ pulling up.

In the silica glass crucible 11 according to the present embodiment, an example of the three-layer structure of stresses in which the second region R2 is adjacent to the first region R1 and the third region R3 respectively has been described, but the structure is not limited thereto. That is, the first region R1 in which a compressive stress is present may be provided on the inner surface IS side, the third region R3 in which a compressive stress is present may be provided on the outer surface OS side of the silica glass crucible 11, and the second region R2 in which a tensile stress is present may be included between the first region R1 and the third region R3. For example, between the first region R1 and the third region R3, a region with a tensile stress and a region with a compressive stress may be alternately repeated. In this case, in the second region R2, a tensile stress and a compressive stress are present in a mixed form.

<Method for Manufacturing Silica Glass Crucible>

FIG. 6 is a flowchart schematically showing steps for manufacturing the silica glass crucible.

In addition, FIG. 7(a) to FIG. 8(b) are schematic views for describing a method for manufacturing the silica glass crucible.

The silica glass crucible 11 is manufactured using a rotational molding method. As shown in FIG. 6, in the rotational molding method, the silica glass crucible 11 is manufactured by: the formation of a silica powder layer in a carbon mold (step S101), arc-melting and depressurization (step S102), cooling (step S103), a polishing treatment (step S104), and rim cutting and an edge treatment (step S105).

First, in the formation of a silica powder layer in a carbon mold shown in the step S101, a carbon mold 20 having a cavity corresponding to the outer form of the silica glass crucible 11 as shown in FIG. 7(a) is prepared. In addition, a first silica powder 201 is supplied to the carbon mold 20 under rotation, scraped using a scraper, and molded up to a predetermined thickness. Therefore, a silica powder layer is formed along the mold inner surface. The carbon mold 20 rotates at a constant speed, and thus the supplied first silica powder 201 remains at a certain position in a state of adhering to the mold inner surface by a centrifugal force, and the shape of the silica powder is maintained. The first silica powder 201 becomes a non-transparent layer and is thus preferably natural silica powder.

Next, as shown in FIG. 7(b), a second silica powder 202 is supplied to the carbon mold 20 in which the layer of the first silica 201 is formed and makes the silica powder layer thicker. The second silica powder 202 is supplied onto the first silica powder 201 on the mold inner surface in a predetermined thickness. The second silica powder 202 is preferably synthetic silica powder, but may be natural silica powder.

Next, in the arc melting and depressurization shown in the step S102, as shown in FIG. 8(a), arc electrodes 30 are installed in the cavity of the carbon mold 20, arc discharging is carried out from the inside of the carbon mold 20 while rotating the carbon mold 20, and the entire silica powder layer is heated to 1,720° C. or higher and melted. At this time, a thin silica glass seal layer is formed throughout the entire circumference. In addition, depressurization is carried out from the carbon mold 20 side at the same time as the heating, a gas in the silica is suctioned to an outer layer side through ventilation holes 21 provided in the carbon mold 20, and voids in the silica powder layer under heating are degassed, thereby removing air bubbles in the crucible inner surface. As a result, the transparent layer 13 substantially including no air bubbles is formed.

In the carbon mold 20, cooling means, not shown, is provided. Therefore, the vitrification of the silica in a portion that serves as the outer surface of the silica glass crucible 11 is prevented. The cooling temperature by the cooling means is a temperature at which the silica is not vitrified and remains as a sintered body and a powder.

After that, the depressurization for degassing is weakened or stopped while continuing the heating, and air bubbles are left, thereby forming the non-transparent layer 15 including a number of fine air bubbles.

Next, in the cooling shown in the step S103, the supply of power to the arc electrodes 30 is stopped, and the molten silica glass is cooled, thereby configuring the silica glass crucible 11. At the time of carrying out the cooling, a cooling gas is blown to the silica glass that serves as the inner surface of the silica glass crucible 11. The distribution of internal residual stresses of the silica glass crucible 11 is determined by cooling conditions such as the cooling rate and a method for blowing the cooling gas. Therefore, it is possible to manufacture the silica glass crucible 11 having a desired strain distribution by adjusting the cooling conditions.

In addition, the internal residual stresses of the silica glass crucible 11 also change due to the heat history during the manufacturing of the crucible. For example, the internal residual stresses change due to a heat history until the completion of the silica glass crucible 11 such as the temperature gradient from the crucible inner surface to the outer surface, the stress distribution in the boundary between a softened portion and a non-softened portion, or the balance of a stress when the softened portion is cooled and solidified.

As described above, the heating state differs from the crucible inner surface side through the outer surface side due to the heat history, and thus it is assumed that a difference appears in the distribution of a force for suppressing the deformation of a heated region and a difference appears in the state of compressive and tensile stress layers distributed in a layer shape from the crucible inner surface side through the outer surface side. Therefore, it is possible to obtain a desired strain distribution of the silica glass crucible 11 by controlling the heat history.

Next, as the polishing treatment shown in the step S104, a sand blast treatment is carried out on the outer surface OS of the silica glass crucible 11, and the outer surface is finished to a predetermined surface roughness. In the present embodiment, the surface roughness of the outer surface OS is set to 50 μm or less in Ra (arithmetic average roughness) and 80 μm or more and 200 μm or less in Rz (maximum height) by this polishing treatment.

In addition, in the rim cutting and the edge treatment shown in the step S105, as shown in FIG. 8(b), a part of the upper end side of the side wall portion 11a of the silica glass crucible 11 removed from the carbon mold 20 is cut, thereby adjusting the height of the silica glass crucible 11. After that, chamfering is carried out on the inner circumferential edge and the outer circumferential edge, which are edges of the upper end surface TP, thereby forming chamfered portions C. After the rim cutting, washing is carried out, thereby completing the silica glass crucible 11.

<Pull-Up Device>

FIG. 9 is a schematic view showing the overall configuration of a pull-up device that is a device for manufacturing a silicon single crystal.

In a chamber 510 forming the external appearance of a pull-up device 500, the silica glass crucible 11 accommodating a silicon melt 23 is provided, and a carbon susceptor 520 is provided so as to cover the outside of the silica glass crucible 11. The carbon susceptor 520 is fixed to the upper end of a supporting shaft 530 parallel to the vertical direction. The silica glass crucible 11 fitted into the carbon susceptor 520 is rotated in a predetermined direction together with the carbon susceptor 520 by the supporting shaft 530 and is movable in the vertical direction so as to be capable of controlling the melt surface of the silicon melt to a constant height relative to a heater 540 in a furnace (such that the temperature gradient becomes constant).

The outer circumferential surfaces of the silica glass crucible 11 and the carbon susceptor 520 are surrounded by the heater 540. The heater 540 is further surrounded by a heat-insulating tube 550. In a process of raw material melting in the growth of a silicon single crystal, a high-purity polycrystalline silicon raw material loaded into the silica glass crucible 11 is heated and melted by heating by the heater 540, and becomes the silicon melt 23.

In the upper end portion of the chamber 510 of the pull-up device 500, pull-up means 560 is provided. A wire cable 561 suspended toward the rotational center of the silica glass crucible 11 is attached to the pull-up means 560, and a pull-up motor (not shown) that winds or unwinds the wire cable 561 is disposed. A seed crystal 24 is attached to the lower end of the wire cable 561. During pulling up, the seed crystal 24 rotates and grows, and, at the same time, a silicon single crystal 25 (ingot) also rotates.

A cylindrical heat-shielding member 570 is provided between the silicon single crystal 25 and the heat-insulating tube 550 so as to surround the silicon single crystal 25 during growth. The heat-shielding member 570 has a cone portion 571 and a flange portion 572. The heat-shielding member 570 is disposed at a predetermined position (hot zone) by attaching the flange portion 572 to the heat-insulating tube 550. The silicon single crystal 25 can be manufacturing using the pull-up device 500 described above.

<Method for Manufacturing Silicon Single Crystal>

FIGS. 10(a) to (c) are schematic views for describing a method for manufacturing a silicon single crystal using the silica glass crucible according to the present embodiment.

The silicon single crystal 25 is manufactured by setting the silica glass crucible 11 according to the present embodiment in the pull-up device 500 described above and pulling up.

First, as shown in FIG. 10(a), polycrystalline silicon is loaded into the silica glass crucible 11, and, in this state, the polycrystalline silicon is heated and melted using a heater disposed around the silica glass crucible 11. Therefore, the silicon melt 23 is obtained. At this time, the use of the silica glass crucible 11 according to the present embodiment can prevent breakage of the crucible during loading.

Next, the lower end of the seed crystal 24 attached to the wire cable 561 is lowered and brought into contact with the silicon melt 23. In addition, the wire cable 561 is slowly lifted while being rotated. Therefore, as shown in FIG. 10(*b*), the silicon single crystal 25 is caused to grow below the seed crystal 24. The silicon single crystal 25 is caused to grow into an ingot as shown in FIG. 10(*c*) by continuously pulling up the wire cable while controlling the pull-up speed.

In the silica glass crucible 11 according to the present embodiment, the breakage or chipping of the inner surface IS or the outer surface OS is suppressed, and thus it is possible to suppress the infusion of a foreign substance during pulling up. In addition, due to the appropriate surface roughness of the outer surface OS, the friction force between the silica glass crucible 11 and the carbon susceptor increases in the CZ pull-up device, the deformation of the silica glass crucible 11 during CZ pulling up is suppressed, and it becomes possible to manufacture a silicon single crystal having excellent quality (for example, the single crystallization rate).

<Ingot of Silicon Single Crystal>

FIG. 11 is a schematic view for exemplifying an ingot of the silicon single crystal.

An ingot 600 of the silicon single crystal is manufactured by setting the silica glass crucible 11 according to the present embodiment in the pull-up device 500 and by being pulled up using the method for manufacturing a silicon single crystal.

The ingot 600 has a shoulder portion 610 on a seed crystal 24 side, a straight body portion 620 continuing from the shoulder portion 610, and a tail portion 630 continuing from the straight body portion 620. It should be noted that there is also a case where the seed crystal 24 is removed from the ingot 600. The diameter of the shoulder portion 610 gradually increases from the seed crystal 24 side toward the straight body portion 620. The diameter of the straight body portion 620 is almost constant. The diameter of the tail portion 630 gradually decreases as being away from the straight body portion 620.

The quality of the ingot 600 has a close relationship with the quality of the silica glass crucible 11 used for the pulling. For example, the infusion of an impurity (for example, an impurity metallic element in the glass) or a foreign substance in the silica glass crucible 11 leads to the occurrence of dislocation of the silicon single crystal in the ingot 600. In addition, depending on the smoothness (unevenness noticeable in the appearance) of the inner surface of the silica glass crucible 11 and the amount or size of air bubbles near the surface, when fine debris (particles or the like peeled off from the crucible inner surface) generated by the chipping of the crucible surface and the breakage or collapse of air bubbles, drops into the silicon melt, the fine debris incorporates into the ingot, and the occurrence of dislocation of the single crystal is caused.

In addition, in a case where there is a breakage chip on the crucible outer surface, when a state in which a small fissure remains on the crucible outer surface, the silicon raw material is loaded into the inside of the crucible, and a force is created and exerted, there is a concern that the fissure may propagate. When this fissure leads to the breakage of the crucible, there is a possibility that the molten silicon raw material may leak.

In the silica glass crucible 11 according to the present embodiment, the breaking or chipping of the inner surface IS or the outer surface OS is suppressed, and thus the generation of a crystal defect in the ingot 600 pulled up by the silica glass crucible 11 is suppressed.

As described above, according to the present embodiment, it becomes possible to provide the silica glass crucible 11 capable of sufficiently ensuring strength of the inner surface IS and the outer surface OS of the silica glass crucible 11, and provide a method for manufacturing a high-quality silicon single crystal. Particularly, the silica glass crucible 11 preferred at the time of manufacturing a silicon single crystal for a semiconductor using the CZ method is provided.

The present embodiment has been described above, but the present invention is not limited to these examples. For example, the respective embodiments described above on which a person skilled in the art appropriately carries out the addition, omission, and design change of a configurational element or an appropriate combination of the characteristics of the respective embodiments are also included in the scope of the present invention as long as those includes the gist of the present invention.

REFERENCE SIGNS LIST

11 Silica glass crucible
11*a* Side wall portion
11*b* Corner portion
11*c* Bottom portion
13 Transparent layer
15 Non-transparent layer
20 Carbon mold
21 Ventilation hole
23 Silicon melt
23*a* Melt surface
24 Seed crystal
25 Silicon single crystal
30 Arc electrode
201 First silica powder
202 Second silica powder
500 Pull-up device
510 Chamber
520 Carbon susceptor
530 Supporting shaft
540 Heater
550 Heat-insulating tube
560 Pull-up means
561 Wire cable
570 Heat-shielding member
571 Cone portion
572 Flange portion
600 Ingot
610 Shoulder portion
620 Straight body portion
630 Tail portion
B Bottom portion
C Chamfered portion
IS Inner surface
OS Outer surface
R1 First region
R2 Second region
R3 Third region
SP1 Sample
SP2 Sample
SP3 Sample
TP Upper end surface
ra Radius
rb Radius
rc Radius

The invention claimed is:

1. A silica glass crucible comprising:
   a cylindrical side wall portion;
   a curved bottom portion; and
   a corner portion that is provided between the side wall portion and the bottom portion and has a higher curvature than a curvature of the bottom portion,
   wherein a first region provided from a crucible inner surface to a middle in a thickness direction,
   a second region that is provided outside the first region in the thickness direction and has a different strain distribution from the first region in the thickness direction, and
   a third region that is provided outside the second region in the thickness direction and up to a crucible outer surface and has a different strain distribution from the second region in the thickness direction are provided,
   internal residual stresses of the first region and the third region are compressive stresses, and
   an internal residual stress of the second region includes a tensile stress,
   wherein the third region has a compressive stress throughout the third region in its entirety in the thickness direction and is as thick as or thicker than the first region in the thickness direction.

2. The silica glass crucible according to claim 1,
   wherein the internal residual stress of the second region does not include a compressive stress, and
   the second region is adjacent to each of the first region and the third region.

3. The silica glass crucible according to claim 1,
   wherein a thickness of the first region in the thickness direction is 1 mm or more from the crucible inner surface.

4. The silica glass crucible according to claim 1,
   wherein a thickness of the third region in the thickness direction is 1 mm or more from the crucible outer surface.

5. The silica glass crucible according to claim 1,
   wherein, at the time of impacting the crucible inner surface via an automatic punch at a force of 300 Newtons (N), a diameter of an indentation on the crucible inner surface is 5 mm or less.

6. The silica glass crucible according to claim 1,
   wherein a surface roughness of the crucible outer surface is 10 µm or more and 50 µm or less in terms of Ra (arithmetic average roughness: JIS (Japanese Industrial Standards) B0601-2001).

7. The silica glass crucible according to claim 3,
   wherein the thickness of the first region in the thickness direction is 3 mm or more from the crucible inner surface.

8. The silica glass crucible according to claim 4,
   wherein a thickness of the third region in the thickness direction is 5 mm or more from the crucible outer surface.

9. The silica glass crucible according to claim 2,
   wherein a thickness of the first region in the thickness direction is 1 mm or more from the crucible inner surface.

10. The silica glass crucible according to claim 2,
    wherein a thickness of the third region in the thickness direction is 1 mm or more from the crucible outer surface.

11. The silica glass crucible according to claim 2,
    wherein, at the time of impacting the crucible inner surface via an automatic punch at a force of 300 Newtons (N), a diameter of an indentation on the crucible inner surface is 5 mm or less.

12. The silica glass crucible according to claim 2,
    wherein a surface roughness of the crucible outer surface is 10 µm or more and 50 µm or less in terms of Ra (arithmetic average roughness: JIS (Japanese Industrial Standards) B0601-2001).

13. The silica glass crucible according to claim 3,
    wherein a thickness of the third region in the thickness direction is 1 mm or more from the crucible outer surface.

14. The silica glass crucible according to claim 3,
    wherein, at the time of impacting the crucible inner surface via an automatic punch at a force of 300 Newtons (N), a diameter of an indentation on the crucible inner surface is 5 mm or less.

15. The silica glass crucible according to claim 3,
    wherein a surface roughness of the crucible outer surface is 10 µm or more and 50 µm or less in terms of Ra (arithmetic average roughness: JIS (Japanese Industrial Standards) B0601-2001).

16. The silica glass crucible according to claim 4,
    wherein, at the time of impacting the crucible inner surface via an automatic punch at a force of 300 Newtons (N), a diameter of an indentation on the crucible inner surface is 5 mm or less and preferably 1 mm or less.

17. The silica glass crucible according to claim 4,
    wherein a surface roughness of the crucible outer surface is 10 µm or more and 50 µm or less in terms of Ra (arithmetic average roughness: JIS (Japanese Industrial Standards) B0601-2001).

18. The silica glass crucible according to claim 5,
    wherein a surface roughness of the crucible outer surface is 10 µm or more and 50 µm or less in terms of Ra (arithmetic average roughness: JIS (Japanese Industrial Standards) B0601-2001).

19. The silica glass crucible according to claim 7,
    wherein a thickness of the third region in the thickness direction is 1 mm or more from the crucible outer surface.

20. The silica glass crucible according to claim 7,
    wherein, at the time of impacting the crucible inner surface via an automatic punch at a force of 300 Newtons (N), a diameter of an indentation on the crucible inner surface is 5 mm or less.

* * * * *